United States Patent
Wang et al.

(10) Patent No.: US 9,246,526 B2
(45) Date of Patent: Jan. 26, 2016

(54) CONVOLUTIONAL DEINTERLEAVING APPARATUS AND ASSOCIATED METHOD

(71) Applicant: MStar Semiconductor, Inc., Hsinchu Hsien (TW)

(72) Inventors: Chun-Chieh Wang, Hsinchu Hsien (TW); Chun-Jung Chen, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 58 days.

(21) Appl. No.: 14/079,896

(22) Filed: Nov. 14, 2013

(65) Prior Publication Data
US 2014/0146928 A1    May 29, 2014

(30) Foreign Application Priority Data
Nov. 23, 2012    (TW) .............................. 101143863 A

(51) Int. Cl.
*H03M 13/00*    (2006.01)
*H04B 1/10*    (2006.01)
*H03M 13/27*    (2006.01)

(52) U.S. Cl.
CPC ......... *H04B 1/1081* (2013.01); *H03M 13/2732* (2013.01)

(58) Field of Classification Search
None
See application file for complete search history.

(56) References Cited

U.S. PATENT DOCUMENTS

| | | | |
|---|---|---|---|
| 6,532,253 B1 * | 3/2003 | Chen | 375/146 |
| 7,657,818 B2 * | 2/2010 | Cioffi et al. | 714/755 |
| 7,881,257 B2 * | 2/2011 | Fauconnier et al. | 370/329 |
| 2004/0062314 A1 * | 4/2004 | Demas et al. | 375/240.28 |
| 2004/0073930 A1 * | 4/2004 | Demas et al. | 725/71 |
| 2005/0091566 A1 * | 4/2005 | Berens et al. | 714/755 |
| 2005/0154963 A1 * | 7/2005 | Lee | 714/763 |
| 2010/0095191 A1 * | 4/2010 | Mudulodu et al. | 714/799 |
| 2010/0321586 A1 * | 12/2010 | Yang | 348/726 |

* cited by examiner

*Primary Examiner* — Daniel McMahon
(74) *Attorney, Agent, or Firm* — Edell, Shapiro & Finnan, LLC

(57) ABSTRACT

A convolutional deinterleaving apparatus includes a memory and a control module. The control module stores a plurality of sets of data into the memory according to a deinterleaving rule. The plurality of sets of data are of a same group. After determining a representative channel state indicator according to an N number of channel state indicators corresponding to an N number of sets of data in the group, the control module stores the representative channel state indicator into the memory. The N number of sets of data of the same group correspond to a same carrier frequency.

16 Claims, 2 Drawing Sheets

CONVOLUTIONAL DEINTERLEAVING APPARATUS AND ASSOCIATED METHOD

This application claims the benefit of Taiwan application Serial No. 101143863, filed Nov. 23, 2012, the subject matter of which is incorporated herein by reference.

BACKGROUND OF THE INVENTION

1. Field of the Invention

The invention relates in general to an integrated services digital broadcasting terrestrial (ISDB-T) reception system, and more particularly to a deinterleaving technique in an ISDB-T reception system.

2. Description of the Related Art

As communication technologies progress, developments of digital television broadcasting have also matured. In addition to cable wires, digital television signals may also be transmitted as wireless signals through equipments such as base stations or satellites. Integrated services digital broadcasting terrestrial (ISDB-T) and digital terrestrial multimedia broadcast (DTMB) are currently two prominent standards in the field of digital television broadcasting. Such standards adopt a transmission technique based on orthogonal frequency-division multiplexing (OFDM) modulation. OFDM modulation is a multi-carrier modulation, which disperses data to many orthogonal sub-carriers in different frequencies in a way that each of the sub-carriers can transmit data at a lower bit transmission rate. A length of inverse fast Fourier transform (IFFT) that generates OFDM signals can be categorized into various modes, each of which corresponds to different carrier lengths and different numbers of delay frames.

To counteract noise interference and multipath distortion during a transmission process, an ISDB-T transmission end and a DTMB transmission end performs time-interleaving and frequency-interleaving on data to be transmitted. Correspondingly, reception ends of the two systems need to perform a convolutional deinterleaving procedure on received data in order to correctly restore the original data. A convolutional deinterleaver, according to a known deinterleaving rule, respectively stores data transmitted by different carriers to a memory (usually a dynamic random access memory (DRAM) or a static random access memory (SRAM)). By appropriately designating storage positions (i.e., selecting correct data/buffer corresponding relations) and arranging delay time periods, the data later sent out from the memory become data having undergone the deinterleaving procedure.

In current techniques, in one set of data, apart from an in-phase component and a quadrature component, a channel state indicator (CSI) corresponding to the set of data is also stored into the memory by the convolutional deinterleaver. The channel state indicator represents channel quality at the time when the reception end including the deinterleaver receives the set of data, and is critical information for subsequently generating an input signal for a Viterbi decoder.

Taking an ISDB-T system for example, each OFDM symbol transmitted to a reception end includes 27960*13 sets of data. Assuming that each set of data and its channel state indicator require a storage space of 20 bits, the above memory for the convolutional deinterleaver is at least in a size of several megabytes (MB). Therefore, the memory capacity required by a convolutional deinterleaver is formidable, and thus constitutes a considerable part in hardware costs of a reception end.

SUMMARY OF THE INVENTION

The invention is directed to a convolutional deinterleaver apparatus and associated method. Through sharing a same channel state indicator by a plurality of sets of data that are time correlated, a memory capacity required by a convolutional deinterleaver can be reduced without noticeably affecting system performance. The apparatus and method according to the present invention are applicable to a digital television broadcasting system such as an ISDB-T or DTMB system adopting a deinterleaving mechanism.

According to an embodiment of the present invention, a deinterleaving apparatus is provided. The deinterleaving apparatus comprises a memory and a control module. The control module stores a plurality of sets of data into the memory according to a deinterleaving rule. The control module regards every N number of sets of data as one group, and determines a representative channel state indicator according to an N number of channel state indicators corresponding to the N number of sets of data of the same group. The control module further stores the representative state indicator into the memory. Reception of the N number of sets of data of the same group is close to one another in time.

According to another embodiment of the present invention, a deinterleaving method is provided. The deinterleaving method comprises the following steps. A plurality of sets of data are stored into a memory according to a deinterleaving rule. A representative channel state indicator is determined according to an N number of channel state indicators corresponding to an N number of sets of data of a same group. Reception of the N number of sets of data of the same group is close to one another in time, where N is an integer greater than 1. The representative channel state indicator is then stored into the memory.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
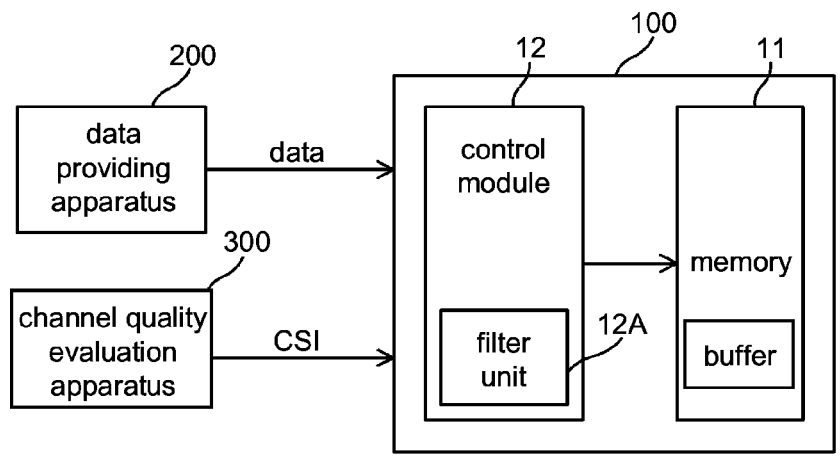
FIG. 1 is a block diagram of a convolutional deinterleaving apparatus and associated circuits according to an embodiment of the present invention.

FIG. 1 shows a convolutional deinterleaving apparatus 100 according to an embodiment of the present invention. The convolutional deinterleaving apparatus 100 comprises a memory 11 and a control module 12. For example, the memory 11 is a DRAM or an SRAM. In practice, the convolutional deinterleaving apparatus 100 may be included in a reception end of a digital television broadcasting system such as an ISDB-T and DTMB system employing a deinterleaving mechanism.

In the embodiment, a data providing apparatus 200 (e.g., a radio-frequency (RF) front-end circuit) sends multiple sets of data to be deinterleaved to the control module 12. Each of the sets of data comprises an in-phase component and a quadrature component. A channel quality evaluation apparatus 300 generates a channel state indicator (CSI) for each set of the multiple sets of data, and sends the channel state indicators to the control module 12. In practice, the convolutional deinterleaving apparatus 100, the data providing apparatus 200 and the channel quality evaluation apparatus 300 may be paired and integrated into a same chip, or altogether integrated into a same chip.

Each time before the deinterleaving apparatus 100 begins a deinterleaving procedure, the control module 12 learns in advance which deinterleaving rule is to be followed. For example, the control module 12 learns the different types of carrier frequencies of an FFT mode adopted by a transmission end and a corresponding interleaving length for this batch of data. The control module 12 further stores each set of data generated and sent from the data providing apparatus 200 into the memory 11 according to the deinterleaving rule. For example, in a same code, data transmitted by different carrier frequencies are stored into different carrier buffers, respectively. Different from the prior art, the control module 12 of the present invention does not store the channel state indicators CSI of all the sets of data of the same carrier frequency into the memory 11. As shown in FIG. 1, the control module 12 may comprise a filter unit 12A for determining whether the channel state indicator that the channel quality evaluation apparatus 300 currently sends to the control module 12 is to be stored into the memory 11, with associated details of the filter process to be described below.

In the embodiment, a plurality of sets of data (e.g., a plurality of codes) generated by the data providing apparatus 200 may be categorized into a plurality of groups according to a convolutional deinterleaving sequence and different carrier frequencies. The number of sets of data included in the groups is not necessarily the same. In general, the closer the reception time among which an N number of sets of data of the same group are at the data providing apparatus 200, the more similar the channel state indicators corresponding to the N number of sets of data are. For example, assume that the N number of sets of data are successively adjacent in a data stream transmitted to the data providing apparatus 200 according to a predetermined carrier frequency, where N is an integer greater than 1, e.g., 2, 4 or 8. Theoretically, the N number of channel state indicators generated for the N number of sets of data is also the same or very close to one another. Through such property, the convolutional deinterleaving apparatus 100 have the N number of sets of data of the same group share the same channel state indicator, so as to achieve an effect of a reduced memory space required by a deinterleaver.

In the embodiment, in addition to time correlation, the same group is sent to the data providing apparatus 200 according to the same carrier frequency. In other words, a plurality of sets of data corresponding to the same carrier frequency are regarded as of the same group. An advantage of the above approach is to ensure the similarity in the channel state indicators of the N number of sets of data to further increase the validity of the representative channel state indicator of the channel state indicators.

The control module 12 determines a representative channel state indicator according to the N number of channel state indicators corresponding to the same group, for the N number of sets of data of the group to share. The above process may be repeatedly performed on every N number of sets of data of the group. In the embodiment, from the N number of channel state indicators corresponding to the N number of sets of data of the same group, the filter unit 12A is designed to select one channel state indicator as the representative channel state indicator, and omits the remaining (N−1) number of channel state indicators, i.e., the (N−1) number of channel state indicators are not stored into the memory 11. For example, assume that N is equal to 4, and the four sets of data are sequentially inputted into the control module 12. The filter unit 12A may select the last set of the four sets of data, and utilize the channel state indicator of the last set of data as the representative channel state indicator of the four sets of data. In an alternative embodiment, the filter unit 12A may select multiple channel state indicators from the N number of channel state indicators corresponding to the N number of sets of data of the same group, and utilize an average of the selected channel state indicators as the representative channel state indicator.

After determining the representative channel state indicator of a group, the control module 12 stores the representative channel state indicator into the memory 11. In practice, the memory 11 may comprise a buffer for storing data and a buffer for storing the representative channel state indicator. In a physical space of the memory 11, given a specific corresponding relationship, the two types of buffers are not necessarily adjacent to each other. Further, the two types of buffers may be divided into multiple sub-buffers according to different carrier frequencies of data, respectively.

Figure 2:
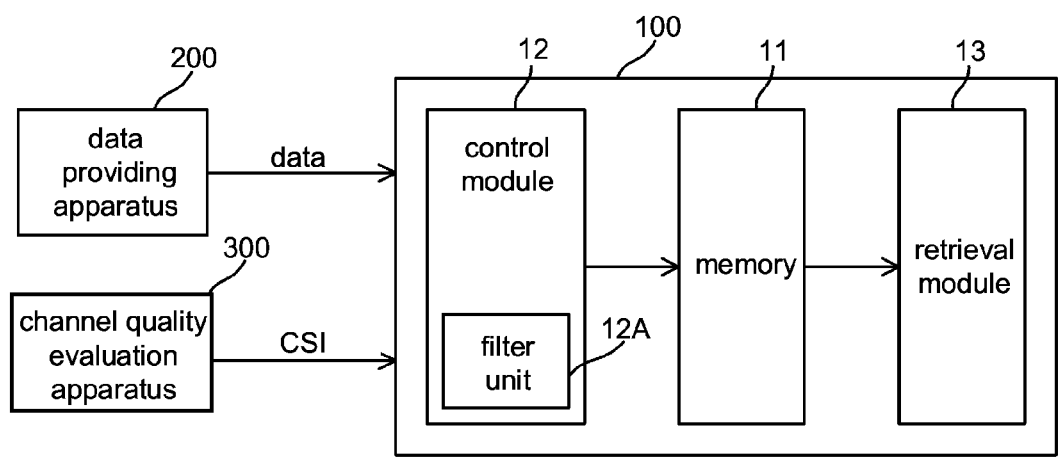
FIG. 2 is a convolutional deinterleaving apparatus further comprising a retrieval module according to an embodiment of the present invention.

As shown in FIG. 2, the deinterleaving apparatus 100 may further comprise a retrieval module 13 for fetching the data and the representative channel state indicator stored in the memory 11 to a subsequent circuit. Each time the retrieval module 13 fetches a set of target data from the memory 11, the representative channel state indicator of the group in which the target data is located can be fetched from the memory 11 according to the above specific corresponding relationship to serve as the channel state indicator of the target data.

It should be noted that N is not limited to a particular value, and the control module 12 may determine the value of N according to a modulation mode, an interleaving mode or a predetermined memory capacity. For example, the control module 12 may adopt a value for N (e.g., equal to 4) for data applied with 64-quadrature amplitude modulation (64-QAM) at the transmission end which is smaller than a value for N (e.g., equal to 8) for data applied with quadrature phase-shift keying (QPSK) at the transmission end. A main reason for the above is that, in modulation methods, when the constellation symbols are closer, the data are more sensitive to a change in the channel state indicator. For another example, the control module 12 may adopt different values of N for data that correspond to different interleaving lengths in an ISDB-T system. Alternatively, the control module 12 may takes the memory capacity of the memory 11 as an upper limit for determining the value of N.

Figure 3:
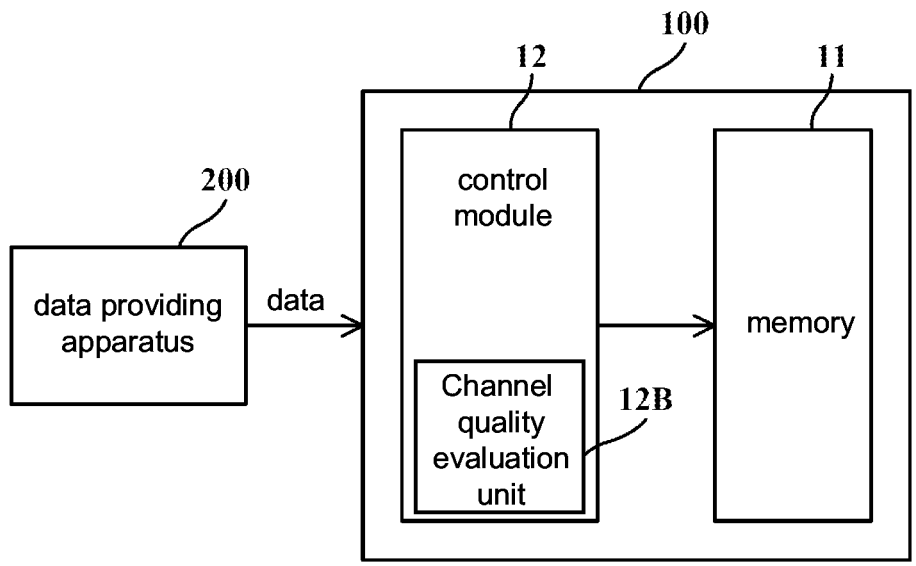
FIG. 3 is an exemplary variation of a convolutional deinterleaving apparatus and associated circuits according to an embodiment of the present invention.

FIG. 3 shows an exemplary variation of the convolution deinterleaving apparatus 100 according to an embodiment. In the embodiment, the channel quality evaluation apparatus 300 and the filter unit 12A are replaced by a channel quality evaluation unit 12B in the control module 12. The channel quality evaluation unit 12B selects a set of representative data from an N number of sets of data of the same group, and generates the corresponding channel state indicator for the representative data to serve as the representative channel state indicator of the group.

As previously stated, the buffer for storing data in the memory 11 is theoretically divided into multiple sub-buffers according to different carrier frequencies. Taking an ISDB-T system for example, a scatter pilot signal that is transmitted along with the data to the data providing apparatus 200 causes the data that the control module 12 transmits to one sub-buffer to correspond to two carrier frequencies instead of one single carrier frequency. Assume that a symbol A represents data (to be referred to as first data) corresponding to a first carrier frequency and a symbol B represents data (to be referred to as second data) corresponding to a second carrier frequency. A distribution mode of data transmitted to a sub-buffer has four possibilities—{AAAA, ABBB, AABB, AAAB}. Taking ABBB for example, the control module 12 first sends one set of first data A to a sub-buffer, and then sequentially sends three sets of second data B to the sub-buffer.

Also as previously described, the sharing of the representative channel state indicator by data having the same carrier frequency increases the validity of the representative channel state indicator. Therefore, for the above situation, one sub-buffer may be designed as including one data buffer and two indicator buffers. The first data A and the second data B are both stored into the data buffer by the control module 12. The first indicator buffer stores the representative channel state indicator corresponding to the first data A, and the second indicator buffer stores the representative channel state indicator corresponding to the second data B. In other words, the first data A and the second data B corresponding to different carrier frequencies may be designed not to share the representative channel state indicator.

In practice, the convolutional deinterleaving apparatus 100 may learn in advance the type of distribution mode of the data stored into a certain sub-buffer. According to the distribution modes of the first data and the second data, the control module 12 may determine when to update the first indicator buffer and the second indicator buffer. Taking the distribution mode ABBB for example, a series of data inputted into a data buffer is sequentially ABBBABBBABBB . . . . The control module 12 may update the two corresponding indicator buffers according to a unit of every eight sets of data (ABBBABBB) satisfying such distribution rule. For example, the control module 12 may select the channel state indicator of the $5^{th}$ set of data (i.e., the latest set of first data A) in the every eight sets of data to serve as the representative channel state indicator of the first data A, and to accordingly update the first indicator buffer. Similarly, the control module 12 may select the channel state indicator of the $8^{th}$ set of data (i.e., the latest set of second data B) in every eight sets of data to serve as the representative channel state indicator, and to accordingly update the second indicator buffer. When an offset exists in the data, e.g., ABBBABBB becomes BABBBABB, the control module 12 is still capable of achieving the same effect by simply changing a selection time point.

It is demonstrated from the above descriptions that the sets of data in the same group, that share a common representative channel state indictor, are not limited in number to a specific value. Provided that subsequent circuits are aware of a corresponding relationship between each set of data and a storage position of a representative channel state indicator that set of data, the data and the representative channel state indictor can still be correctly fetched from the memory 11.

Figure 4:
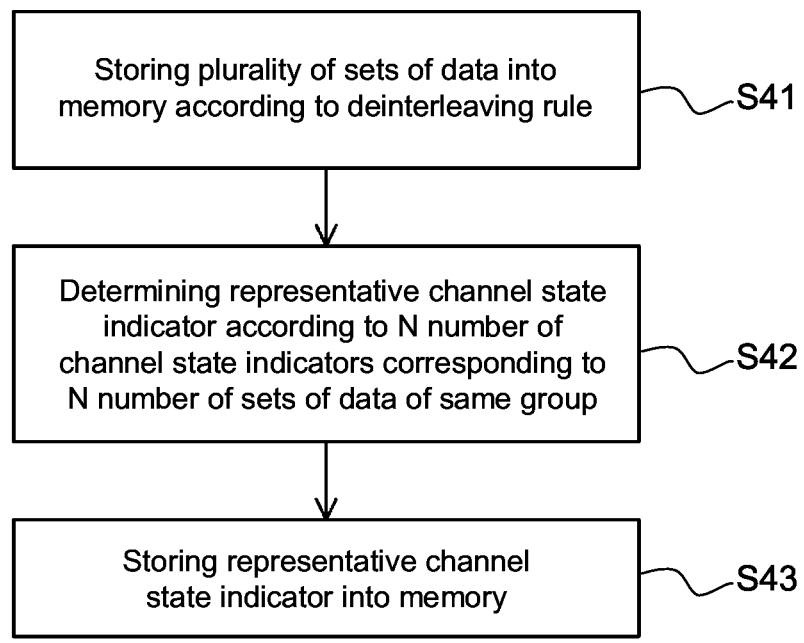
FIG. 4 is a flowchart of a convolutional deinterleaving method according to an embodiment of the present invention.

A convolutional deinterleaving method is provided according to another embodiment of the present invention. FIG. 4 shows a flowchart of the convolutional deinterleaving method. In step S41, a plurality of sets of data are stored into a memory according to a deinterleaving rule. In step S42, a representative channel state indicator is determined according to an N number of channel state indicators corresponding to an N number of sets of data of a same group. Reception of the N number of data of the same group is close to one another in time, where N is an integer greater than 1. In step S43, the representative channel state indicator is stored into the memory.

Details of different circuit operations and variations (e.g., the method for determining the representative channel state indicator and the method for determining the value N) described in association with the convolutional deinterleaving apparatus 100 are applicable to the convolutional deinterleaving method in FIG. 4, and shall be omitted herein.

A convolutional deinterleaving apparatus and associated method are as disclosed in the foregoing embodiments. Through sharing a same channel state indicator by a plurality of sets of data that are time correlated, a memory capacity required by a convolutional deinterleaver can be reduced without noticeably affecting system performance. The apparatus and method according to the present invention are applicable to a digital television broadcasting system such as an ISDB-T or DTMB system adopting a deinterleaving mechanism.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A convolutional deinterleaving apparatus, comprising:
a memory; and
a control module, configured to store a plurality of sets of data of a same group into the memory according to a deinterleaving rule, select a representative channel state indicator according to an N number of channel state indicators corresponding to an N number of sets of data of the same group, and store the representative channel state indicator into the memory;
wherein, the N number of sets of data of the same group correspond to a same carrier frequency, where N is an integer greater than 1,
wherein the memory comprises a data buffer, a first indicator buffer and a second indicator buffer; the control module stores a plurality of sets of first data corresponding to a first carrier frequency and a plurality of sets of second data corresponding to a second carrier frequency into the data buffer; the first indicator buffer stores the representative channel state indicator of the plurality of sets of first data, and the second indicator buffer stores another representative channel state indicator of the plurality of sets of second data; and the control module determines update time points of the first indicator buffer and the second indicator buffer according to a distribution mode of the plurality sets of first data and the plurality sets of second data.

2. The convolutional deinterleaving apparatus according to claim 1, wherein the control module selects a channel state indicator from the N number of channel state indicators corresponding to the N number of sets of data to serve as the representative channel state indicator, and omits remaining (N−1) channel state indicators.

3. The convolutional deinterleaving apparatus according to claim 1, wherein the control module determines value of N according to a modulation mode, an interleaving mode of the N number of sets of data, or a predetermined memory capacity.

4. The convolutional deinterleaving apparatus according to claim 1, wherein the control module comprises:
a channel quality evaluation unit, configured to generate the channel state indicators corresponding to the plurality of sets of data; and
a filter unit, configured to determine whether a channel state indicator generated by the channel quality evaluation unit is the representative channel state indicator.

5. The convolutional deinterleaving apparatus according to claim 1, wherein the control module comprises:
a channel quality evaluation unit, configured to select a set of representative data from the N number of sets of data of the same group, and generate a channel state indicator corresponding to the representative data to serve as the representative channel state indicator.

6. The convolutional deinterleaving apparatus according to claim 1, further comprising:
a retrieval module, configured to fetch a set of target data from the plurality of sets of data stored in the memory, and simultaneously fetch the representative channel state indicator of the same group in which the set of target data is located from the memory to serve as an output channel state indicator of the set of target data.

7. The convolutional deinterleaving apparatus according to claim 1, wherein reception of the N number of sets of data of the same group are successively adjacent in a data stream.

8. The convolutional deinterleaving apparatus according to claim 1, wherein the control module selects a latest set of data in any N number of sets of the first data to serve as a set of representative data, and stores the channel state indicator corresponding to the representative data into the first indicator buffer.

9. A convolutional deinterleaving method, comprising:
a) storing a plurality of sets of data into a memory according to a deinterleaving rule, the plurality of sets of data being of a same group;
b) selecting a representative channel state indicator according to an N number of channel state indicators corresponding to an N number of sets of data of the group, wherein the N number of sets of data of the same group correspond to a same carrier frequency, where N is an integer greater than 1; and
c) storing the representative channel state indicator into the memory,
wherein the memory comprises a data buffer, a first indicator buffer and a second indicator buffer; step (a) comprises storing a plurality of sets of first data corresponding to a first carrier frequency and a plurality of sets of second data corresponding to a second carrier frequency into the data buffer; the first indicator buffer stores the representative channel state indicator of the plurality of sets of first data, and the second indicator buffer stores another representative channel state indicator of the plurality of sets of second data; and step (b) comprises determining update time points of the first indicator buffer and the second indicator buffer according to a distribution mode of the plurality sets of first data and the plurality sets of second data.

10. The convolutional deinterleaving method according to claim 9, wherein step (b) comprises selecting a channel state indicator from the N number of channel state indicators corresponding to the N number of sets of data to serve as the representative channel state indicator, and omitting remaining (N−1) channel state indicators.

11. The convolutional deinterleaving method according to claim 9, further comprising:
determining value of N according to a modulation mode, an interleaving mode of the N number of sets of data, or a predetermined memory capacity.

12. The convolutional deinterleaving method according to claim 9, wherein step (b) comprises:
generating the channel state indicators corresponding to the plurality of sets of data; and
determining whether a channel state indicator generated is the representative channel state indicator.

13. The convolutional deinterleaving method according to claim 9, wherein step (b) comprises:
selecting a set of representative data from the N number of sets of data of the same group, and generating a channel state indicator corresponding to the representative data to serve as the representative channel state indicator.

14. The convolutional deinterleaving method according to claim 9, further comprising:
fetching a set of target data from the plurality of sets of data stored in the memory, and simultaneously fetching the representative channel state indicator of the same group in which the set of target data is located from the memory to serve as an output channel state indicator of the set of target data.

15. The convolutional deinterleaving method according to claim 9, wherein reception of the N number of sets of data of the same group are successively adjacent in a data stream.

16. The convolutional deinterleaving method according to claim 9, wherein step (b) comprises selecting a latest set of data in every N number of sets of the first data to serve as a set of representative data, and storing the channel state indicator corresponding to the representative data into the first indicator buffer.

* * * * *